United States Patent
Sato

(10) Patent No.: US 6,617,618 B2
(45) Date of Patent: *Sep. 9, 2003

(54) LIGHT EMITTING SEMICONDUCTOR DEVICE WITH GAINNAS ACTIVE LAYER AND GAAS SPACER LAYERS

(75) Inventor: Shunichi Sato, Miyagi-ken (JP)

(73) Assignee: Ricoh Company Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/083,124

(22) Filed: Feb. 27, 2002

(65) Prior Publication Data

US 2002/0125489 A1 Sep. 12, 2002

Related U.S. Application Data

(63) Continuation of application No. 09/045,927, filed on Mar. 23, 1998, now Pat. No. 6,382,800.

(30) Foreign Application Priority Data

Mar. 21, 1997 (JP) .............................. 9-068726

(51) Int. Cl.[7] .............................................. H01L 33/00
(52) U.S. Cl. ........................... 257/103; 257/13; 257/14; 257/96; 257/97; 257/201; 257/615; 372/45
(58) Field of Search ....................... 257/12–14, 94, 257/96, 97, 103, 183, 201, 613, 615; 372/45

(56) References Cited

U.S. PATENT DOCUMENTS

| | | | | |
|---|---|---|---|---|
| 4,127,862 A | * | 11/1978 | Ilegems et al. ............... 357/30 |
| 5,903,586 A | | 5/1999 | Ramdani et al. ............. 372/45 |
| 5,912,913 A | | 6/1999 | Kondow et al. ............. 372/45 |
| 5,923,691 A | | 7/1999 | Sato ............................. 372/46 |
| 5,943,357 A | | 8/1999 | Lebby et al. ................. 372/50 |
| 5,943,359 A | | 8/1999 | Ramdani et al. ............. 372/96 |
| 5,978,398 A | | 11/1999 | Ramdani et al. ............. 372/45 |
| 6,046,096 A | | 4/2000 | Ouchi .......................... 438/510 |
| 6,382,800 B2 | * | 5/2002 | Sato ............................. 257/103 |

FOREIGN PATENT DOCUMENTS

| JP | 7-0154023 | 6/1995 |
|---|---|---|
| JP | 8-195522 | 7/1996 |

OTHER PUBLICATIONS

Kondow et al, "Room–Temperature Pulsed Operation of GaInNAs Laser Diodes with Excellent High–Temperature Performance," Jpn. J. Appl. Phys., vol. 35, pp. 5711–5713, Nov. 11, 1996.

* cited by examiner

Primary Examiner—Bradley W. Baumeister
(74) Attorney, Agent, or Firm—Oblon, Spivak, McClelland, Maier & Neustadt, P.C.

(57) ABSTRACT

A light emitting semiconductor device, comprising:

a lower cladding layer of $Al_zGa_{1-z}As$ ($0<z\leq1$) alloy semiconductor layers, having a first conductivity type;

a lower light guide layer of $Al_zGa_{1-z}As$ ($0<z\leq1$) alloy semiconductor layers, having a band gap narrower than that of the lower cladding layer;

a lower spacing layer, comprising at least one molecular layer of GaAs;

a $Ga_xIn_{1-x}N_yAs_{1-y}$ ($0\leq x\leq1$ and $0<y<1$) active layer, having a thickness less than the critical thickness so as not to give rise to misfit dislocations and having a band gap narrower than that of the lower light guide layer;

an upper spacing layer, comprising at least one molecular layer of GaAs;

an upper light guide layer of $Al_zGa_{1-z}As$ ($0<z\leq1$) alloy semiconductor layers, having a band gap narrower than that of the active layer and narrower than that of the lower cladding layer; and an upper cladding layer of $Al_zGa_{1-z}As$ ($0<z\leq1$) alloy semiconductor layers, having a second conductivity type, each grown on a semiconductor substrate in the order above recited.

6 Claims, 4 Drawing Sheets

LIGHT EMITTING SEMICONDUCTOR DEVICE WITH GAINNAS ACTIVE LAYER AND GAAS SPACER LAYERS

CROSS REFERENCE TO RELATED APPLICATION

This is a continuation of application Ser. No. 09/045,927, filed Mar. 23, 1998, now U.S. Pat. No. 6,382,800.

BACKGROUND OF THE INVENTION

1. Field of the Invention

The present invention relates to semiconductor devices and, more particularly, to light emitting semiconductor devices having excellent carrier confinement capabilities.

2. Description of the Related Art

As communication systems have developed, with both desired and used information transmission rates increasing, more attention has been paid to the development of optical communication systems. As presently contemplated, communication systems will be used from information terminal stations to transmission lines to individual subscriber's circuits.

To implement and extend such systems, it is necessary to use optical devices such as, for example, light emitting devices, such as laser diodes and light emitting diodes, and photoreceptors, such as PIN photodiodes and avalanche photodiodes. It is desired that these devices be made smaller and less expensive.

For example, although light emitting devices, such as laser diodes, are conventionally accompanied by a cooling device, such as a Peltier element or heat sink to control device temperatures generated by input currents, it is highly desirable for the laser diodes be stably operable even without cooling devices to widely implement light emitting devices in the communication system.

To materialize the stable operation of the laser diodes at practical operation temperatures, it is desirable that these devices have improved device capabilities, such as relatively low threshold current density and low temperature variation of their characteristics. However, such improved capabilities, in particular, temperature characteristics, have not been achieved for conventional GaInPAs/InP laser diodes which contain a GaInPAs active layer with InP cladding layers, both fabricated on an InP substrate, due to the difficulties in achieving a relatively large value of the conduction band discontinuity for these materials.

Several semiconductor laser diodes have been reported to materialize the improved temperature characteristics.

For example, a laser diode containing a GaInNAs active layer disposed on a GaAs substrate is disclosed in Japanese Laid-Open Patent Application No. 6-37355. Therein, it is described that GaInAs layers, having a lattice constant larger than that of GaAs, are added with nitrogen to form GaInNAs layers and to thereby be lattice-matched to GaAs with a resulting reduced lattice constant. As result, it is also disclosed that light emissions at 1.3 $\mu$m or 1.5 $\mu$m become feasible in these devices.

As another example, calculated results of the energy level line-up are described by Kondo et al in *Japanese Journal of Applied Physics,* Vol. 35 (1996), pages 1273–5, for a laser diode containing a GaInNAs active layer disposed on a GaAs substrate. It has been suggested in the disclosure that, since the GaInNAs system is lattice-matched to GaAs, a large value of the valence band discontinuity may be acquired by providing cladding layers with AlGaAs rather than the materials which are similarly lattice-matched to GaAs, to thereby be capable of fabricating laser diodes having improved temperature characteristics. In addition, it is also described that the confinement of holes are feasible for the junction structure of a GaInNAs active layer with an AlGaAs layer.

As another example, a laser diode is described by Kondo et al in *Japanese Journal of Applied Physics,* Vol. 35 (1996), pages 5711–3. As disclosed therein, the laser diode consists of AlGaAs cladding layers with a thickness of about 1.4 $\mu$m, GaAs light guide layers with a thickness of about 140 nm, and GaInNAs quantum wells which have a thickness of about 7 nm and the compressive-strained structure Kondo et al demonstrate that the hole confinement is feasible in the GaInNAs layer even with GaAs light guide layers, as long as the GaInNAs layer (1) has a lattice-constant sufficiently larger than that of GaAs and (2) is compressive-strained.

On the other hand, for the GaInNAs active layers which have a lattice constant smaller than that of a GaAs substrate and which have tensile strain, the hole confinement is generally deemed to be unfeasible with light guide layers of GaAs. To realize the hole confinement in the above configuration, accordingly, alloy layers having wider band gap energies such as $Al_zGa_{1-z}As$ ($0<z\leqq1$) or $Ga_tIn_{1-t}P_uAs_{1-u}$ ($0<t<1$ and $0<u\leqq1$) alloy layers must be provided contiguous to the GaInNAs active layer. However, both the feasibility and attainment of semiconductor laser diodes having a GaInNAs active layer lattice-matched to GaAs substrate remain elusive.

In addition, there is disclosed in Japanese Laid-Open Patent Application No.7-154023, a laser diode containing an n-GaAs substrate with the following contiguous layers grown thereon, in the order recited: a GaAs buffer layer with 1 $\mu$m thickness doped with Si, a GaInP cladding layer of 2 $\mu$m thickness doped n-type with Si, a GaInAsP first light guide layer of n-type and 0.2 $\mu$m thickness, a GaAs second light guide layer of n-type and 0.1 $\mu$m thickness, a GaInAsN (Ga 0.74, N 0.01) active layer of 0.1 $\mu$m thickness with a 1.9% strain, a GaAs second light guide layer of p-type and 0.1 $\mu$m thickness, a GaInAsP first light guide layer of p-type and $\mu$m thickness, a GaInP cladding layer of 0.1 $\mu$m thickness doped p-type with Zn, a GaAs contact layer with 1 $\mu$m thickness doped with Si, a GaAs current blocking layer doped with Si, and a GaAs contact layer doped with Zn.

Although a GaInAsN active layer of 0.1 $\mu$m thickness with a 1.9% strain is described in the disclosure mentioned just above, the crystalline quality of this layer growth does not appear satisfactory because the 0.1 $\mu$m thickness of the strained active layer exceeds the critical thickness, thereby resulting in misfit dislocations.

Also, there is described in that disclosure a contact layer doped with Si is disposed between a p-type GaInP cladding layer doped with Zn and a GaAs contact layer doped with Si. Since currents in the laser device flow through the above portion, this averts the currents from the active layer, thereby causing unfavorable results for the laser operation.

In addition, as aforementioned, a laser diode containing a GaInNAs active layer disposed on a GaAs substrate is disclosed in Japanese Laid-Open Patent Application No. 6-37355. However, no detailed description is provided regarding the layer configuration for the laser device. Rather, only the possibility of possible devices but not their feasibility is described.

Yet another laser diode is disclosed in *Japanese Journal of Applied Physics,* Vol. 35 (1996), pages 5711–3, containing quantum well active layers which are having relatively large compressive strains. However, no description is provided regarding active layers tensile strained or lattice-matched to a GaAs substrate.

Thus, a need exists for an improved light emitting semiconductor device and fabrication process therefor.

SUMMARY OF THE INVENTION

Accordingly, it is an object of the present invention to provide an improved light emitting semiconductor devices and fabrication processes therefor, having most, if not all, of the advantages and features of similar employed devices and related processes, while eliminating many of the aforementioned disadvantages of other structures.

In one embodiment of the present invention, a light emitting semiconductor device contains a semiconductor substrate with the following contiguous layers grown thereon, in the order recited: an $Al_zGa_{1-z}As$ ($0<z\leq1$) or $Ga_tIn_{1-t}P_uAs_{1-u}$ ($0<t<1$ and $0<u\leq1$) lower cladding layer disposed on the semiconductor substrate, having a first conductivity type; a lower spacing layer containing at least one GaAs monolayer; a $Ga_xIn_{1-x}N_yAs_{1-y}$ active layer, having a thickness less than the critical thickness so as not to give rise to misfit dislocations; an upper spacing layer containing at least one GaAs monolayer; an $Al_zGa_{1-z}As$ ($0<z\leq1$) or $Ga_tIn_{1-t}P_uAs_{1-u}$ ($0<t<1$ and $0<u\leq1$) upper cladding layer, having a second conductivity type, characterized in that the active layer is (1) contiguous to both the lower and upper spacing layers to thereby be disposed on the cladding layers with relative ease, and (2) capable of composing the light emitting device with excellent device characteristics.

In another embodiment, the present invention provides a light emitting semiconductor device which contains the above-mentioned active layer which is composed of a quantum well layer and has a narrow band gap energy, and the lower and upper spacing layers each containing at least one GaAs monolayer; and further provided with lower and upper light guide layers, each of which is composed of $Al_zGa_{1-z}As$ ($0<z\leq1$) or $Ga_tIn_{1-t}P_uAs_{1-u}$ ($0<t<1$ and $0<u\leq1$) alloy layers, and have band gap energies wider than that of the active layer and narrower than those of the cladding layers. The lower light guide layer is intermediate the lower cladding layer and lower spacing layer, while the upper light guide layer is intermediate the upper cladding layer and upper spacing layer.

By this layer configuration, an improved carrier confinement can be achieved by the light guide layer with a surprisingly wider band gap energy than that of GaAs.

In still another embodiment, a light emitting semiconductor device is provided containing a semiconductor substrate with the following contiguous layers grown thereon, in the order recited: an n-$Ga_{0.5}In_{0.5}P$ lower cladding layer with a thickness of approximately 1.5 µm, a GaAs lower spacing layer with a thickness of approximately 20 nm, a $Ga_{0.9}In_{0.1}N_{0.03}As_{0.97}$ active layer which is approximately lattice-matched to the semiconductor substrate, has a thickness of about 0.1 µm and a photoluminescence peak wavelength of approximately 1.3 µm, a GaAs upper spacing layer with a thickness of approximately 20 nm, and a p-$Ga_{0.5}In_{0.5}P$ upper cladding layer with a layer thickness of approximately 1.5 µm.

By this structure, light emissions of approximately 1.3 µm can be achieved for the light emitting semiconductor device of the present invention, having improved temperature characteristics over conventional devices composed GaInPAs active layers on an InP substrate.

In yet another embodiment, a light emitting semiconductor device is provided containing a semiconductor substrate with the following contiguous layers grown thereon, in the order recited: $Al_{0.5}Ga_{0.5}As$ lower cladding layer with a thickness of approximately 1.5 µm, an $Al_{0.2}Ga_{0.8}As$ lower light guide layer with a thickness of approximately 120 nm, a GaAs lower spacing layer with a thickness of approximately 2 nm, an active layer composed of a $Ga_{0.94}In_{0.06}N_{0.04}As_{0.96}$ quantum well which is tensile strained, and has a thickness of about 10 nm and a photoluminescence peak wavelength of approximately 1.3 µm; a GaAs upper spacing layer with a thickness of approximately 2 nm, an $Al_{0.2}Ga_{0.8}As$ upper light guide layer with a thickness of approximately 120 nm, and an p-$Al_{0.5}Ga_{0.5}As$ upper cladding layer with a layer thickness of approximately 1.5 µm.

With this structure, the light emitting semiconductor device of the present invention with tensile strained quantum well layers affords light emissions of approximately 1.3 µm.

BRIEF DESCRIPTION OF THE DRAWINGS

The present invention together with its various features and advantages, can be more easily understood from the following more detailed description taken in conjunction with the accompanying drawings in which.

DESCRIPTION OF THE PREFERRED EMBODIMENTS

Figure 1:
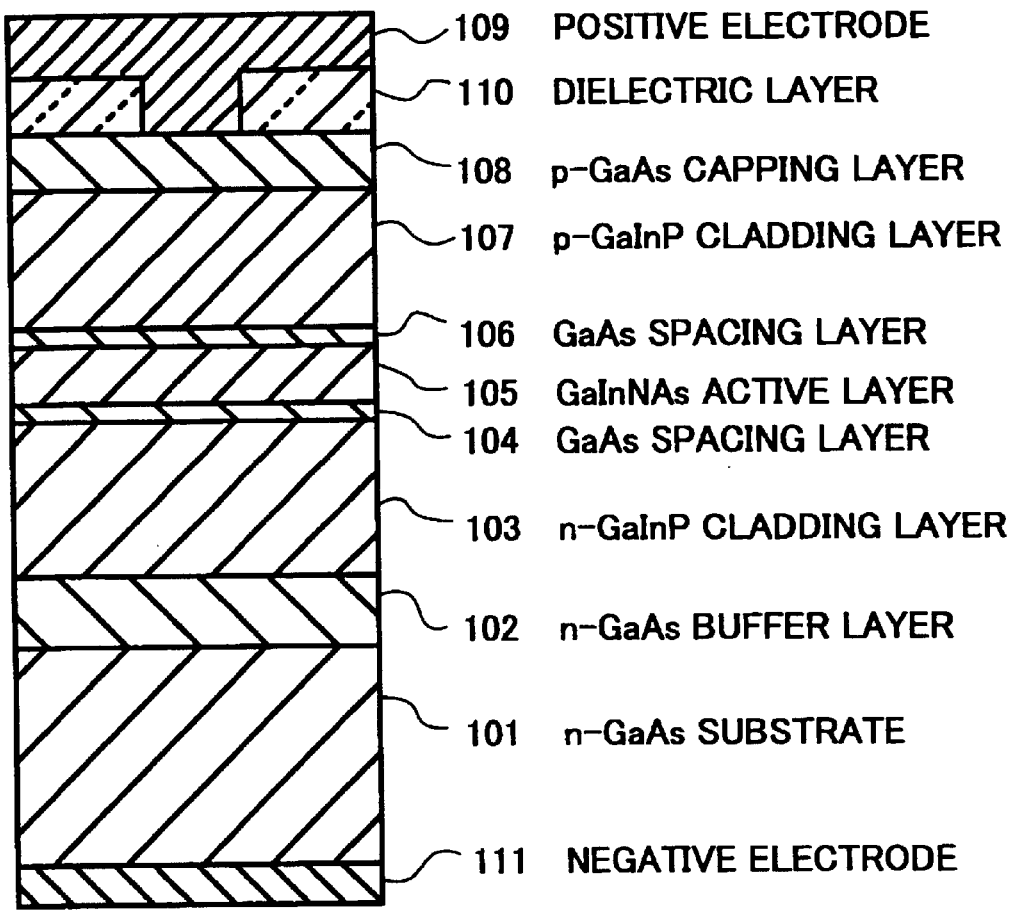
FIG. 1 is a cross-sectional view of a light emitting semiconductor device in accordance with an embodiment of the present invention.

In the description which follows, specific embodiments of the present invention advantageously used in light emitting device applications are described. It is understood, however, that the present invention is not limited to these embodiments. For example, it is appreciated that the structure and methods for fabrication of light emitting semiconductor devices are adaptable to any form of semiconductor devices. Other embodiments will be apparent to those skilled in the art.

In obtaining the present invention, rigorous and extensive experimentation has been conducted with semiconductor laser devices having GaInNAs layers which are lattice-matched to, or tensile strained with, GaAs substrates provided with cladding layers. As a result, it was found to be difficult for the GaInNAs active layers to be provided directly onto the above-mentioned $Al_zGa_{1-z}As$ ($0<z\leq1$) or $Ga_tIn_{1-t}P_uAs_{1-u}$ ($0<t<1$ and $0<u\leq1$).

Since almost all of nitrogen-containing alloy semiconductors are in the non-miscible region in the solid solubility diagram, the growth of these alloy semiconductors are generally quite difficult by conventional crystal growth methods and a minute amount of nitrogen can be incorporated in semiconductor crystals only by non-equilibrium growth methods such as, for example, metal organic chemical vapor deposition (MOCVD) and molecular beam epitaxy (MBE).

For alloy semiconductors, in general, the non-miscibility increases with increasing the number of constituent elements, and also toward the middle of the elemental composition. In other word, binary alloys can be grown most easily. This is also true for the alloy semiconductors containing nitrogen as a group V element. Alloys having an elemental composition more close to GaNAs can therefore be grown with more ease among the GaInNAs alloy system.

To elucidate the above-mentioned trend, a plurality of GaInNAs alloy layers various in the In content are grown on GaAs substrates by MOCVD.

For the present layer growth, source materials, such as trimethylgallium (TMG), trimethylindium (TMI), arsine ($AsH_3$), and dimethylhydrazine (DMHY) as the nitrogen source, were used, while hydrogen is used as carrier gas. During the layer growth, a substrate temperature of 630° C. is used, and only the feeding rate of trimethylindium as the In source is varied.

GaInNAs alloy layers thus obtained are analyzed by secondary ion mass spectroscopy (SIMS) and the results on the N content are shown in Table 1 in the alloy layers various in In contents.

TABLE 1

| In content (%) | N content (%) |
| --- | --- |
| 7 | 2.5 |
| 13 | 1.7 |
| 23 | 0.5 |
| 28 | 0.3 |

The results in Table 1 indicate that the N content decreases with increasing the In contents.

Other results from the layer growth indicates that the growth rate of the alloy layers are also affected by the material surface of the substrate.

When GaInNAs alloy layers are epitaxially grown on GaAs substrates and have a peak wavelength of photoluminescence (PL) spectra of equal to or more than 1.1 $\mu$m, the alloy layers are found to have a mirror surface. By contrast, being grown on AlGaAs substrates and having also the peak wavelength of equal to or more than 1.1 $\mu$m, no mirror finished surface is formed for the GaInNAs alloy layers, and light emitting devices with satisfactory light emitting device characteristics are generally known difficult to be fabricated with the latter alloy layer configuration.

The present invention is predicted in part by the discovery that the formation of GaInNAs layers directly on AlGaAs layers is more difficult than the growth of GaInNAs alloy layer onto GaAs layers for the following reasons: At the interface between GaInNAs and AlGaAs layers, a mixed alloy layer of AlGaNAs or AlGaInNAs is primarily formed during the layer growth, which is more difficult than the formation of GaInNAs layers, thereby giving rise to no mirror finished surface.

To fabricate light emitting semiconductor devices having excellent device characteristics, the present inventor has investigated materials and structures for the semiconductor device which contains (1) $Al_zGa_{1-z}As$ ($0<z\leq1$) or $Ga_tIn_{1-t}P_uAs_{1-u}$ ($0<t<1$ and $0<u\leq1$) alloy semiconductor layers with wide band gap energies and (2) GaInNAs active layers, and which have a satisfactory property for the carrier confinement in the active layer.

During experimentation, an assumption was made, that (1) when GaInNAs is epitaxially grown on GaInP, mixed alloy layers of GaInNP or GaInNPAs are primarily formed at the interface, and (2) for layers GaInNAs to be formed directly on GaInP layers, therefore, mixed alloy layers of GaInNP or GaInNPAs must grow under conditions such that the GaInNAs layers can grow on GaInP layers.

The growth of alloy layers of GaInNP is then carried out. However, GaInNP layers with a mirror finished surface can not be formed under the conditions similar to those for the GaInNAs layer growth, and the surface of the layers tends to be more smooth with decreasing N contents. In addition, under the conditions favorable for the growth of GaInNAs layers having a photoluminescence peak wavelength of approximately 1.3 $\mu$m, a maximum N content for obtaining a mirror finished layer surface is approximately 0.5%, and higher N contents result in adversary effects on the surface.

Although the N content in GaInNAs alloy layers of approximately 3% is preferred to implement the present invention, this surpasses the above-mentioned result of approximately 0.5%, indicating difficulties in either forming a mirror finished surface for GaInNAs layers or achieving satisfactory characteristics for light emitting devices.

Another assumption was also made, that (1) when GaInNAs layers are epitaxially grown on AlGaAs layers, mixed alloy layers of AlGaNAs or AlGaInNAs are primarily formed at the interface, and (2) for layers GaInNAs to be formed directly on AlGaAs layers, therefore, mixed alloy layers of AlGaNAs or AlGaInNAs have to grow under the conditions that GaInNAs layers can grow on AlGaAs layers.

The growth of AlGaNAs alloy layers is then carried out. However, AlGaNAs layers with a mirror finished surface can not be formed under the conditions similar to those of the GaInNAs layer growth. Although the surface of the layers tends to be more smooth with decreasing N contents, difficulties are foreseen in achieving satisfactory characteristics for light emitting devices.

During the experimentation, it has also been found that GaInNAs alloy layers are formed on GaAs layers, having a mirror finished surface and a photoluminescence peak wavelength of approximately 1.3 $\mu$m.

In one embodiment of the present invention, the structure of a light emitting semiconductor device contains a semiconductor substrate with the following contiguous layers grown thereon, in the order recited, which has a structure similar to that illustrated in FIG. 1: a lower cladding layer of $Al_zGa_{1-z}As$ ($0<z\leq1$) or $Ga_tIn_{1-t}P_uAs_{1-u}$ ($0<t<1$ and $0<u\leq1$) alloy semiconductor layers, having a first conductivity type; a $Ga_xIn_{1-x}N_yAs_{1-y}$ ($0\leq x\leq1$ and $0<y<1$) active layer, having a thickness less than the critical thickness so as not to give rise to misfit dislocations; and an upper cladding layer, having a second conductivity type.

In addition, lower and upper spacing layers, each comprising at least one GaAs monolayer, are further provided. The lower spacing layer is intermediate the lower cladding layer and the active layer, while the upper spacing layer is intermediate the upper cladding layer and the active layer.

The above-mentioned active layer may preferably be lattice-matched to the semiconductor substrate within a rate of the lattice strain of 0.3%. Since the active layer is lattice-matched to the substrate with a lattice strain of 0.3% at most, the $Al_zGa_{1-z}As$ ($0<z\leq1$) or $Ga_tIn_{1-t}P_uAs_{1-u}$ ($0<t<1$ and $0<u\leq1$) alloy layer, and the alloy layer which includes $Ga_xIn_{1-x}N_yAs_{1-y}$ ($0\leq x\leq1$ and $0<y<1$), which may have a thickness exceeding 50 nm, can be stratified with relative ease.

As aforementioned, the lower and upper spacing layers preferably comprise at least one GaAs monolayer for the following reasons: From the present experimental results, it has been found that the deposition of $Ga_xIn_{1-x}N_yAs_{1-y}$ ($0 \leq x \leq 1$ and $0<y<1$) layers onto $Al_zGa_{1-z}As$ ($0<z \leq 1$) or $Ga_tIn_{1-t}P_uAs_{1-u}$ ($0<t<1$ and $0<u \leq 1$) alloy layers is feasible by covering the surface of the $Al_zGa_{1-z}As$ or $Ga_tIn_{1-t}P_uAs_{1-u}$ layers with at least one GaAs monolayer.

The thickness of the spacing layer is preferably one tenth at most of the carrier diffusion length, the reason being that carriers can be satisfactorily confined within the active layer due to the thickness of the active layer thin enough compared with the carrier diffusion length.

By this construction of the present embodiment, a laser diode may preferably be fabricated, comprising the active layer of $Ga_xIn_{1-x}N_yAs_{1-y}$ alloy semiconductor layers disposed on the $Al_zGa_{1-z}As$ or $Ga_tIn_{1-t}P_uAs_{1-u}$ alloy layers, thereby achieving excellent device characteristics.

Figure 2:
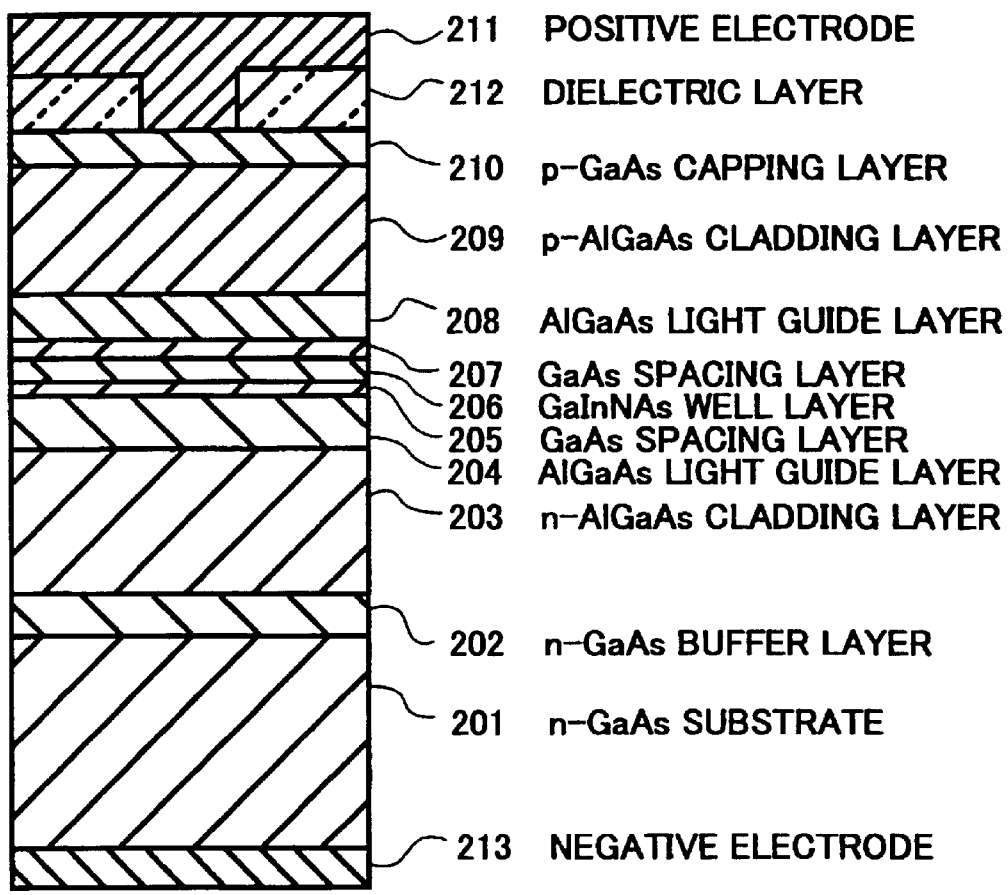
FIG. 2 is a cross-sectional view of a light emitting semiconductor device in accordance with another embodiment of the present invention, in which an active layer is tensile strained.
Figure 4:
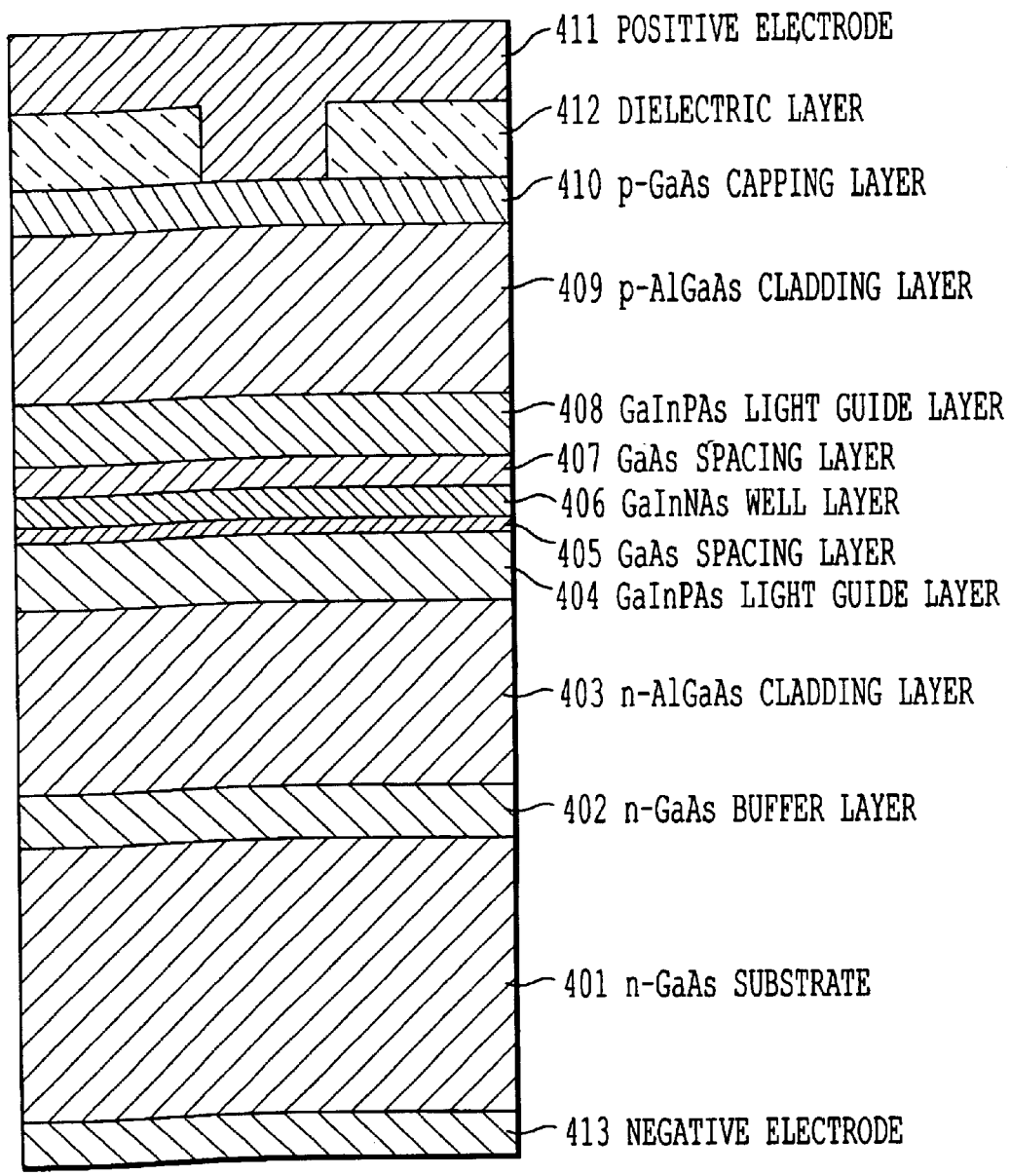
FIG. 4 is a cross-sectional view of a light emitting semiconductor device in accordance with another embodiment of the present invention, in which an active layer is tensile strained.

In other embodiments of the invention, as illustrated in FIG. 2 and FIG. 4 a light emitting semiconductor device comprises an active layer which comprises a $Ga_xIn_{1-x}N_yAs_{1-y}$ ($0 \leq x \leq 1$ and $0<y<1$) quantum well layer with a tensile strain and a narrow band gap energy, the lower and upper spacing layers comprising at least one GaAs monolayer; lower and upper light guide layers comprising alloy semiconductor layers of $Al_zGa_{1-z}As$ ($0<z \leq 1$) (FIG. 2) or $Ga_tIn_{1-t}P_uAs_{1-u}$ ($0<t<1$ and $0<u \leq 1$) (FIG. 4) which have band gap energies wider than of the active layer and narrower than those of the cladding layers. The lower light guide layer is intermediate the lower cladding layer and lower spacing layer, while the upper light guide layer is intermediate the upper cladding layer and upper spacing layer.

This structure is therefore characterized in that the lower and upper spacing layers are each provided intermediate the active layer and the light guide layer, and the active layer is exerted by a tensile strain. Furthermore, the active layer may preferably be lattice-matched to the substrate with a lattice strain of within 0.3% at most. Since the active layer for the light emitting device is formed lattice-matched to the substrate, the active layer may have an increased thickness such as more than 50 nm, for example.

Also in the present structure, the lower and upper spacing layers preferably comprise at least one molecular layer of GaAs, based on the same reasons as those described earlier in the previous embodiment.

By this construction of the present embodiment with the spacing layers, a laser diode may preferably be fabricated, comprising the tensile strained active layer composed of the $Ga_xIn_{1-x}N_yAs_{1-y}$ quantum well layer disposed on the $Al_zGa_{1-z}As$ or $Ga_tIn_{1-t}P_uAs_{1-u}$ alloy layers.

Figure 3:
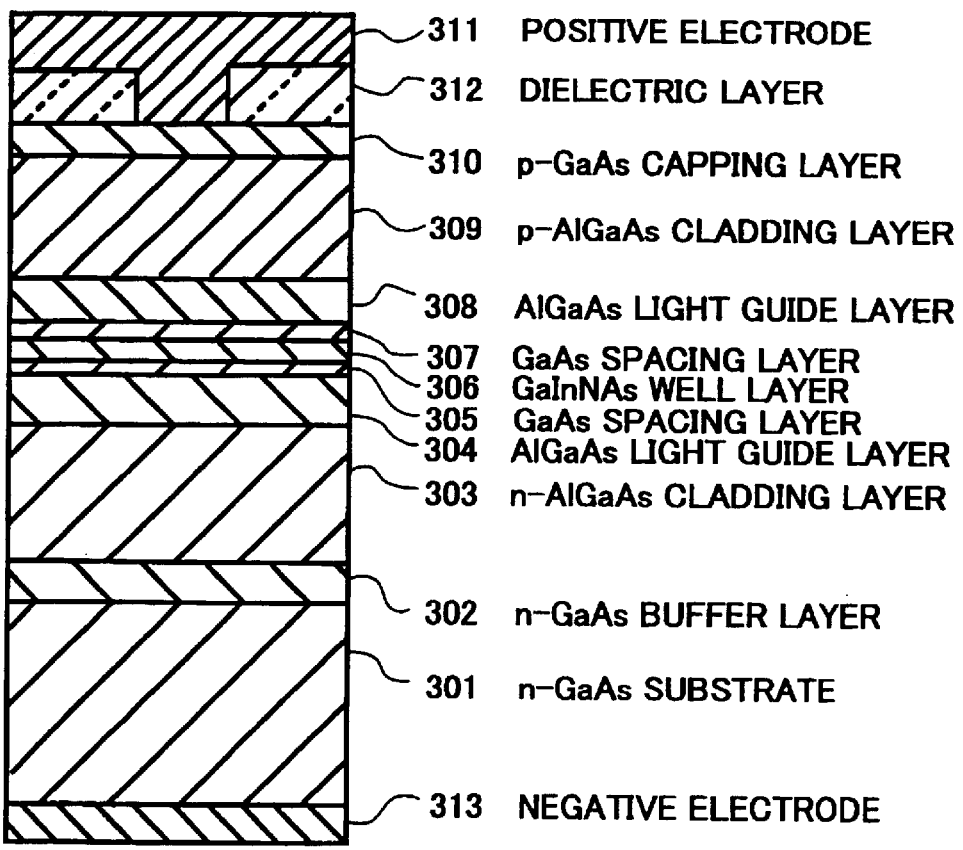
FIG. 3 is a cross-sectional view of a light emitting semiconductor device in accordance with another embodiment of the present invention, in which an active layer is compressive strained.

In still another embodiment of the invention, as illustrated in FIG. 3, a light emitting semiconductor device comprises an active layer which comprises a $Ga_xIn_{1-x}N_yAs_{1-y}$ quantum well layer with a compressive strain and a narrow band gap energy, and the lower and upper well layer with a compressive strain and a narrow band gap energy, and the lower and upper spacing layers comprising at least one GaAs monolayer, lower and upper light guide layers which comprise alloy semiconductor layers of $Al_zGa_{1-z}As$ ($0<z \leq 1$) or $Ga_tIn_{1-t}P_uAs_{1-u}$ ($0<t<1$ and $0<u \leq 1$), and have band gap energies wider than that of the active layer and narrower than those of the cladding layers. The lower light guide layer is intermediate the lower cladding layer and lower spacing layer, while the upper light guide layer is intermediate the upper cladding layer and upper spacing layer.

This structure is therefore characterized in that the active layer is exerted by a compressive strain.

Also in the present structure, the lower and upper spacing layers preferably comprise at least one GaAs monolayer, based on the same reasons as described earlier in the previous embodiment.

The layer configuration of the present embodiment facilitates to fabricate a laser diode, comprising the compressive strained $Ga_xIn_{1-x}N_yAs_{1-y}$ quantum well layer disposed on $Al_zGa_{1-z}As$ or $Ga_tIn_{1-t}P_uAs_{1-u}$ alloy layers. With this layer configuration, device characteristics such as a low threshold current or temperature coefficient can be improved for the laser diodes having 1.3 µm emissions over conventional laser diodes provided with GaAs light guide layers.

Reference will now be made to certain Examples which are provided solely for purposes of illustration and which are not intended to be limitative.

EXAMPLE 1

A light emitting semiconductor device according to the invention as illustrated in FIG. 1 was fabricated, wherein the device was a double heterostructure laser with the dielectric-stripe structure.

The structure of the light emitting semiconductor device comprised an n-GaAs substrate 101 with the following contiguous layers grown thereon, in the order recited: an n-GaAs buffer layer 102, an n-$Ga_{0.5}In_{0.5}P$ lower cladding layer 103, a GaAs lower spacing layer 104, a $Ga_{0.9}In_{0.1}N_{0.03}As_{0.97}$ active layer 105, a GaAs upper spacing layer 106, a p-$Ga_{0.5}In_{0.5}P$ upper cladding layer 107, and a p-GaAs capping (contact) layer 108. In addition, a dielectric layer 110 was disposed on the capping layer 108, a portion of which was removed to form a current inlet.

Additionally provided for the device were a positive electrode 109 formed an ohmic contact with the capping layer 108 in the above-mentioned removed portion and a negative electrode 111 on the rear side of the GaAs substrate 101.

An n-GaAs substrate, having the direction normal to the surface misoriented by 15° from the direction normal to the (100) plane toward the [011] direction was preferably used as the substrate.

The approximate thickness of each of the layers was preferably 1.5 µm for the lower and upper cladding layers 103 and 107, 20 nm for the lower and upper spacing layers 104 and 106, and 0.4 µm for the capping layer 108.

In addition, the active layer 105 had a thickness of about 0.1 µm, wherein the active layer was approximately lattice-matched to the substrate 101, and had a photoluminescence peak wavelength of approximately 1.3 µm.

This device was fabricated by MOCVD, using source materials such as trimethylgallium (TMG), trimethylindium (TMI), phosphine ($PH_3$), arsine ($A_sH_3$) and dimethylhydrazine (DMHY) as the nitrogen source, while hydrogen was used as carrier gas. During the layer growth, the selection of the materials to be introduced into an MOCVD reaction vessel was appropriately made corresponding to the composition of the layer to be grown.

Subsequently, laser emissions were observed for the thus fabricated device, indicating that the electron confinement was actually achieved for the device. Also found was that the temperature characteristics of the laser device were superior to those of conventional 1.3 µm laser diodes comprising a GaInPAs active layer disposed on InP substrates.

It has been also found that the nitrogen content in the GaInPAs layer 105 increases with (1) increasing the feeding ratio of $DMH_y$ to $AsH_3$, (2) decreasing temperatures for, or (3) increasing speed of, the layer growth. Therefore, by appropriately adjusting the conditions for the above-mentioned feeding ratio, temperatures or speed, it is possible to control the nitrogen content in the active layer, thereby capable of fabricating laser diode comprising GaInNAs layers various in nitrogen content.

The thickness of each of the lower and upper spacing layers is not limited to 20 nm, as mentioned above, but also preferably of a thickness of at least one GaAs monolayer. This process was employed, based on the aforementioned present experimental results, in that the deposition of GaIn-NAs layers onto a $Ga_{0.5}In_{0.5}P$ layer was feasible with relative ease by completely covering the surface of the $Ga_{0.5}In_{0.5}P$ layer with at least one GaAs monolayer.

EXAMPLE 2

A light emitting semiconductor device according to the invention as illustrated in FIG. 2 was fabricated, wherein the device was a dielectric-striped double heterostructure laser, having an SCH-SQW (separate confinement heterostructure with a single quantum well) structure, provided with (1) an active layer with the device yield and (2) a light guide layer without either the device yield or absorption loss.

As shown in FIG 2, the structure of the light emitting semiconductor device comprised an n-GaAs substrate 201 with the following contiguous layers grown thereon, in the order recited: an n-GaAs buffer layer 202, an n-$Al_{0.5}Ga_{0.5}As$ lower cladding layer 203, and $Al_{0.2}Ga_{0.8}As$ lower light guide layer 204, a GaAs lower spacing layer 205, $Ga_{0.94}In_{0.06}N_{0.06}As_{0.96}$ quantum wells (active layer) 206, a GaAs upper spacing layer 207, an $Al_{0.2}Ga_{0.8}As$ upper light guide layer 208, a p-$Al_{0.5}Ga_{0.5}As$ upper cladding layer 209, and a p-GaAs capping layer 210. In addition, a dielectric layer 212 was disposed on the capping layer 210, a portion of which was removed to form a current inlet.

As shown in FIG 4, the structure of the light emitting semiconductor device comprised an n-GaAs substrate 401 with the following contiguous layers grown thereon, in the order recited: an n-GaAs buffer layer 402, an n-$Al_{0.5}Ga_{0.5}As$ lower cladding layer 403, and GaInPAs lower light guide layer 404, a GaAs lower spacing layer 405, $Ga_{0.94}In_{0.06}N_{0.06}As_{0.96}$ quantum wells (active layer) 406, a GaAs upper spacing layer 407, an GaInPAs upper light guide layer 408, a p-$Al_{0.5}Ga_{0.5}As$ upper cladding layer 409, and a p-GaAs capping layer 410. In addition, a dielectric layer 412 was disposed on the capping layer 410, a portion of which was removed to form a current inlet.

Additionally provided for the device were a positive electrode 211 (411) which forms an ohmic contact with the capping layer 210 (410) in the above-mentioned removed portion, and a negative electrode 213 (413) on the rear side of the GaAs substrate 201 (401).

The approximate thickness of each of the layers was, preferably, 1.5 μm for the lower and upper cladding layers 203 (403) and 209 (409), 120 nm for the lower and upper light guide layers 204 (404) and 208 (408), 2 nm for the lower and upper spacing layers 205 (405) and 207 (407) and 0.4 μm for the capping layer 210 (410).

In addition, the thickness of the active layer 206 was preferably about 10 nm, wherein the active layer had a photoluminescence peak wavelength of approximately 1.3 μm and the lattice constant of unstrained well layer 306 (or isolated $Ga_{0.8}In_{0.2}N_{0.02}As_{0.98}$ layers) is larger than that of the substrate 201.

This device was fabricated by MOCVD, using source materials such as trimethylalluminum (TMA), trimethygallium (TMG), trimethylindium (TMI), arsine ($AsH_3$) and dimethylhydrazine (DMHY) as the nitrogen source, while hydrogen was used as carrier gas. During the layer growth, the selection of the materials to be introduced into a reaction vessel was appropriately made corresponding to the composition of the layer to be grown.

Subsequently, the thus fabricated device was subjected to evaluation test measurements, and it has been found that the threshold current density is lower, and the temperature characteristics are better, than those of laser diodes containing GaAs light guide layers, which is preferable for the practical laser applications.

It has also been found that the nitrogen content in the GaInNAs layer 206 increases with (1) increasing the feeding ratio of DMHy to $AsH_3$, (2) decreasing temperatures for, or (3) increasing speed of, the layer growth. Therefore, by appropriately adjusting the conditions for the above-mentioned feeding ratio, temperatures or speed, it is possible to control the nitrogen content in the active layer, thereby capable of fabricating laser diode comprising GaInNAs layers various in the nitrogen content.

Although there was described in Example 2 the $Ga_{0.94}In_{0.06}N_{0.04}As_{0.96}$ active layer 206 for the light emitting device, the composition of the active layer is not limited to the above-mentioned composition, but may be different GaInNAs layers which are tensile strained.

For example, to implement the present invention and to carry out carrier confinement, GaInNAs layers with a smaller lattice constant are preferred due to (1) the lowering its valence band energy level caused by the decrease in the lattice constant, and (2) the concomitant more effective hole confinement achieved by AlGaAs light guide or cladding layers which have wider band gap energies than that of GaAs layers.

The thickness of each of the lower and upper spacing layers, 205 and 207, is not limited to 2 nm, as mentioned above, but also preferably of a thickness of at least one GaAs monolayer. This process was employed, based on the aforementioned present experimental results by the present inventor, in that the deposition of GaInNAs layers onto a $Ga_{0.5}In_{0.5}P$ layers was feasible with relative ease by completely covering the surface of the $Ga_{0.5}In_{0.5}P$ layers with at least one molecular layer of GaAs.

EXAMPLE 3

A light emitting semiconductor device according to the invention as illustrated in FIG. 3 was fabricated, wherein the device was also a dielectric-striped double heterostructure laser, having an SCH-SQW (separate confinement heterostructure with a single quantum well) structure, provided with (1) an active layer with the device yield and (2) a light guide layer without either the device yield or absorption loss.

The structure of the light emitting semiconductor device comprised an n-GaAs substrate 301 with the following contiguous layers grown thereon, in the order recited: an n-GaAs buffer layer 302, an n-$Al_{0.5}Ga_{0.5}As$ lower cladding layer 303, and $Al_{0.2}Ga_{0.8}As$ lower light guide layer 304, a GaAs lower spacing layer 305, $Ga_{0.8}In_{0.2}N_{0.02}As_{0.98}$ quantum wells (active layer) 306, a GaAs upper spacing layer 307, an $Al_{0.2}Ga_{0.8}As$ upper light guide layer 308, a p-$Al_{0.5}Ga_{0.5}As$ upper cladding layer 309, and a p-GaAs capping layer 310. In addition, a dielectric layer 312 was disposed on the capping layer 310, a portion of which was removed to form a current inlet.

Additionally provided for the device were a positive electrode 311 formed an ohmic contact with the capping layer 310 in the above-mentioned removed portion, and a negative electrode 313 on the rear side of the GaAs substrate 301.

The approximate thickness of each of the layers was, preferably, 1.5 μm for the lower and upper cladding layers 303 and 309, 12 nm for the lower and upper light guide layers 304 and 308, 2 nm for the lower and upper spacing layers 305 and 307, and 0.4 μm for the capping layer 310.

In addition, the thickness of the active layer 306 was preferably about 10 nm, wherein the active layer had a photoluminescence peak wavelength of approximately 1.3 μm, and the lattice constant of unstrained well layer 206 (or isolated $Ga_{0.94}In_{0.06}N_{0.04}As_{0.96}$ layers) is smaller than that of the substrate 201, having a compressive strain of a ratio of about 1%.

This device was fabricated by MOCVD using source materials such as trimethylalluminum (TMA), trimethylgallium (TMG), trimethylindium (TMI), arsine ($AsH_3$) and dimethylhydrazine (DMHY) as the nitrogen source, while hydrogen was used as carrier gas. During the layer growth, the selection of the materials to be introduced into a reaction vessel was appropriately made corresponding to the composition of the layer to be grown.

Subsequently, the thus fabricated device was subjected to evaluation test measurements, and it has been found that the threshold current density is lower, and the temperature characteristics are better, than those of laser diodes comprising GaAs light guide layers, which is preferable for the practical laser applications.

It has also been found that the nitrogen content in the GaInNAs layer 206 increases with (1) increasing the feeding ratio of DMHy to $AsH_3$, (2) decreasing temperatures for, or (3) increasing speed of, the layer growth. Therefore, by appropriately adjusting the conditions for the above-mentioned feeding ratio, temperatures or speed, it is possible to control the nitrogen content in the active layer, thereby capable of fabricating laser diode comprising GaInNAs layers various in the nitrogen content.

Although there was employed for the light emitting device in Example 3 the $Ga_{0.8}In_{0.2}N_{0.02}As_{0.98}$ active layer which had a lattice constant lager by 1% than that of the layers lattice-matched to GaAs, the active layer is not limited to that above-mentioned, but may also be other GaInNAs layers which have a different composition and compressive strain.

For example, to implement the present invention and to carry out carrier confinement, GaInNAs layers with a smaller lattice constant are preferred due to (1) the lowering its valence band energy level caused by the decrease in the lattice constant, and (2) the concomitant more effective hole confinement achieved by AlGaAs light guide layers which have wider band gap energies than that of GaAs layers. To form GaInNAs layers on AlGaAs layers mentioned just above and to achieve excellent crystalline quality of the layers, the lower and upper spacing layers were satisfactorily employed in the present embodiment.

The thickness of each of the lower and upper spacing layers, 305 and 307, is not limited to 2 nm as mentioned above, but also preferably of a thickness of at least one GaAs monolayer. This process was employed, based on the aforementioned experimental results, in that the deposition of GaInNAs layers onto $Al_{0.2}Ga_{0.8}As$ layers was feasible with relative ease by completely covering the surface of the $Al_{0.2}Ga_{0.8}As$ layers with at least one GaAs monolayer.

According to the present invention, therefore, light emitting semiconductor devices may be provided, having improved crystalline and interface structure of accumulated layers in the device.

For example, as aforementioned, spacing layers which are composed of at least one of GaAs monolayer and contiguous to the active layer, facilitates the formation of GaInNAs active layers on the cladding layers, to thereby achieving satisfying crystalline quality of the stratified layer structure and to achieve excellent device characteristics for the light emitting device.

As another example, by providing spacing layers intermediate the active layer and the light guide layer, device characteristics such as a low threshold current or temperature coefficient are improved for the laser diodes over conventional laser diodes provided with GaAs light guide layers.

This application is based on Japanese Patent Application 9-068726, filed with the Japanese Patent Office on Mar. 21, 1997, the entire contents of which are hereby incorporated by reference.

Specific embodiments of the invention particularly useful in light emitting device applications have been described. However, it is to be understood that the above-described device configurations are merely illustrative of the many possible specific embodiments which can be devised to represent application of the principles of the invention. Numerous and varied other configurations can be devised in accordance with these principles by those skilled in the art without departing from the spirit and scope of the present invention.

In particular, it should be noted many other structural embodiments of laser diodes are possible than the relatively simple dielectric-striped laser diodes described in the above examples. In addition, the present invention may be adopted not only to other light emitting devices such as light emitting diodes, but also to photo-diodes of the infrared wavelength region.

What is claimed is:

1. A light emitting semiconductor device, comprising:

a lower cladding layer of $Al_zGa_{1-z}As$ (0<z≦1) alloy semiconductor layers, having a first conductivity type;

a lower light guide layer of $Al_zGa_{1-z}As$ (0<z≦1) alloy semiconductor layers, having a band gap narrower than that of said lower cladding layer;

a lower spacing layer having a thickness of about 2 nm, comprising at least one molecular layer of GaAs;

a $Ga_xIn_{1-x}N_yAs_{1-y}$ (0≦x≦1 and 0<y<1) active layer, having a thickness less than the critical thickness so as not to give rise to misfit dislocations and having a band gap narrower than that of the lower light guide layer;

an upper spacing layer having a thickness of about 2 nm, comprising at least one molecular layer of GaAs;

an upper light guide layer of $Al_zGa_{1-z}As$ (0<z≦1) alloy semiconductor layers, having a band gap wider than that of said active layer and narrower than that of said lower cladding layer; and an upper cladding layer of $Al_zGa_{1-z}As$ (0<z≦1) alloy semiconductor layers, having a second conductivity type, each grown on a semiconductor substrate in the order above recited, wherein at least the lower and upper spacing layers directly contact the active layer.

2. The light emitting semiconductor device according to claim 1, wherein said active layer is compressively strained against said substrate.

3. The light emitting semiconductor device according to claim 1, wherein the thickness of said lower and upper spacing layers is at most one-tenth of the carrier diffusion length.

4. A light emitting semiconductor device, comprising:
- a lower cladding layer of $Al_zGa_{1-z}As$ ($0<z\leq1$) alloy semiconductor layers, having a first conductivity type;
- a lower light guide layer of $Ga_tIn_{1-t}P_uAs_{1-u}$ ($0<t<1$ and $0<u<1$) alloy semiconductor layers, having a band gap narrower than that of said lower cladding layer;
- a lower spacing layer having a thickness of about 2 nm, comprising at least one molecular layer of GaAs;
- a $Ga_xIn_{1-x}N_yAs_{1-y}$ ($0\leq x\leq1$ and $0<y<1$) active layer, having a thickness less than the critical thickness so as not to give rise to misfit dislocations and having a band gap narrower than that of the lower light guide layer;
- an upper spacing layer having a thickness of about 2 nm, comprising at least one molecular layer of GaAs;
- an upper light guide layer of $Ga_tIn_{1-t}P_uAs_{1-u}$ ($0<t<1$ and $0<u\leq1$) or $Al_zGa_{1-z}As$ ($0<z\leq1$) alloy semiconductor layers, having a band gap wider than that of said active layer and narrower than that of said lower cladding layer; and
- an upper cladding layer of $Al_zGa_{1-z}As$ ($0<z\leq1$) alloy semiconductor layers, having a second conductivity type,
- each grown on a semiconductor substrate in the order above recited, wherein at least the lower and upper spacing layers directly contact the active layer.

5. The light emitting semiconductor device according to claim 4, wherein said active layer is compressively strained against said substrate.

6. The light emitting semiconductor device according to claim 4, wherein the thickness of said lower and upper spacing layers is at most one-tenth of the carrier diffusion length.

* * * * *

UNITED STATES PATENT AND TRADEMARK OFFICE
CERTIFICATE OF CORRECTION

PATENT NO. : 6,617,618 B2
DATED : September 9, 2003
INVENTOR(S) : Shunichi Sato

It is certified that error appears in the above-identified patent and that said Letters Patent is hereby corrected as shown below:

Column 13,
Line 10, "0<u<1)" should read -- $0<u\leq1$) --.

Signed and Sealed this

Second Day of August, 2005

JON W. DUDAS
*Director of the United States Patent and Trademark Office*